(12) United States Patent
Lee et al.

(10) Patent No.: US 8,963,674 B2
(45) Date of Patent: Feb. 24, 2015

(54) TUNABLE INDUCTOR

(75) Inventors: Wen-Chang Lee, Taipei (TW);
Yen-Horng Chen, Taipei (TW);
Augusto Marques, Moscavide (PT)

(73) Assignee: MediaTek Singapore Pte. Ltd., Singapore (SG)

( * ) Notice: Subject to any disclaimer, the term of this patent is extended or adjusted under 35 U.S.C. 154(b) by 754 days.

(21) Appl. No.: 13/182,448

(22) Filed: Jul. 14, 2011

(65) Prior Publication Data

US 2012/0154073 A1   Jun. 21, 2012

Related U.S. Application Data

(60) Provisional application No. 61/424,974, filed on Dec. 20, 2010.

(51) Int. Cl.
| | |
|---|---|
| *H01F 21/12* | (2006.01) |
| *H03H 7/01* | (2006.01) |
| *H01F 27/36* | (2006.01) |

(52) U.S. Cl.
CPC .............. *H01F 21/12* (2013.01); *H03H 7/0153* (2013.01); *H01F 27/36* (2013.01); *H01F 2021/125* (2013.01)
USPC ........................................... 336/200; 333/174

(58) Field of Classification Search
CPC ... H01F 21/00; H01F 21/12; H01F 2021/125; H03H 7/0153
USPC ............................ 336/200; 333/172, 174, 262
See application file for complete search history.

(56) References Cited

U.S. PATENT DOCUMENTS

| | | |
|---|---|---|
| 5,872,489 A | 2/1999 | Chang |
| 6,549,096 B2 | 4/2003 | Groves |

(Continued)

FOREIGN PATENT DOCUMENTS

| | | |
|---|---|---|
| CN | 2121741 U | 11/1992 |
| CN | 1875484 A | 12/2006 |

(Continued)

OTHER PUBLICATIONS

Pietro Andreani, Kirill Kozmin, Per Sandrup, Thomas Mattsson, "A transmitter CMOS VCO for WCDMA/EDGE", 2010 IEEE, pp. 146-149, IEEE, USA.

(Continued)

*Primary Examiner* — Benny Lee
*Assistant Examiner* — Rakesh Patel
(74) *Attorney, Agent, or Firm* — Winston Hsu; Scott Margo

(57) ABSTRACT

A tunable inductor includes a main wiring and at least one tuning module. The main wiring is arranged to encircle an inductor area of the tunable inductor. In addition, the tuning module is arranged to couple associated nodes of the main wiring. For example, each tuning module of the at least one tuning module includes a first switch positioned within the inductor area, and further includes at least one auxiliary wiring. When the first switch is turned on, the tuning module couples two nodes of the main wiring, where the at least one auxiliary wiring is arranged to couple the two nodes when the first switch is turned on. In particular, a patterned ground plane is arranged to decrease the energy loss of the tunable inductor, and more particularly, to prevent the tunable inductor from suffering energy loss. The patterned ground plane includes some conductive sections forming a W-like shape.

18 Claims, 15 Drawing Sheets

(56) References Cited

U.S. PATENT DOCUMENTS

| | | | |
|---|---|---|---|
| 6,621,365 B1 | 9/2003 | Hallivuori | |
| 7,460,001 B2* | 12/2008 | Jessie | 336/200 |
| 2006/0033602 A1* | 2/2006 | Mattsson | 336/200 |
| 2011/0051308 A1* | 3/2011 | Chan | 361/268 |

FOREIGN PATENT DOCUMENTS

| | | |
|---|---|---|
| CN | 101253585 A | 8/2008 |
| CN | 101253586 A | 8/2008 |

OTHER PUBLICATIONS

Murat Demirkan, Stephen P. Bruss, Richard R. Spencer, "Design of Wide Tuning-Range CMOS VCOs Using Switched Coupled-Inductors", IEEE Journal of Solid-State Circuits, vol. 43, No. 5, May 2008, pp. 1156-1163, IEEE, USA.

Seong-Mo Yim, Kenneth K. O, "Switched Resonators and Their Applications in a Dual-Band Monolithic CMOS LC-Tuned VCO", IEEE Transactions on Microwave Theory and Techniques, vol. 54, No. 1, Jan. 2006, pp. 74-81, IEEE, USA.

* cited by examiner

TUNABLE INDUCTOR

CROSS REFERENCE TO RELATED APPLICATIONS

This application claims the benefit of U.S. provisional application No. 61/424,974, which was filed on Dec. 20, 2010 and entitled "SWITCHABLE INDUCTOR" and is incorporated herein by reference.

BACKGROUND

The present invention relates to frequency coverage of a LC tank oscillator such as voltage controlled oscillator (VCO) or digitally controlled oscillator (DCO), and more particularly, to a tunable inductor.

When a mobile phone is designed to operate in multiple modes respectively corresponding to different telecommunication specifications, multiple DCOs may be required for being utilized in these modes, respectively. According to the related art, the DCOs may be integrated into a single DCO implemented by utilizing capacitance tuning, in order to save the chip area. However, some problems may occur. First of all, the tuning range of conventional DCO implemented by capacitive tuning relies on the parasitic capacitance of switch, which is limited by the maximum allowed signal swing for a specific process. Secondly, the conventional DCO implemented by capacitive tuning may suffer compromised performance whenever a large tuning range is required, since the majority of capacitance is allocated for tunable purpose which usually comes with more loss than non-tunable capacitance. Thus, there is a need for a tunable inductor, in order to implement a single DCO with large tuning range.

SUMMARY

It is therefore an objective of the claimed invention to provide a tunable inductor, in order to solve the above-mentioned problems.

An exemplary embodiment of a tunable inductor comprises a main wiring and at least one tuning module. The main wiring is arranged to define (more particularly, encircle) an inductor area of the tunable inductor. In addition, the at least one tuning module comprises: at least one auxiliary wiring, positioned within the inductor area, coupled between two nodes of the main wiring; and a first switch, disposed on the at least one auxiliary wiring, arranged to selectively couple the two nodes of the main wiring with each other.

An exemplary embodiment of a tunable inductor comprises a main wiring, at least one tuning module, and a patterned ground plane. The main wiring is arranged to define (more particularly, encircle) an inductor area of the tunable inductor. In addition, the at least one tuning module is arranged to selectively couple associated nodes of the main wiring. Additionally, the patterned ground plane is arranged to decrease the energy loss of the tunable inductor, wherein the patterned ground plane comprises a plurality of first conductive sections, and a portion of the first conductive sections is arranged to form a W-like shape.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1A:
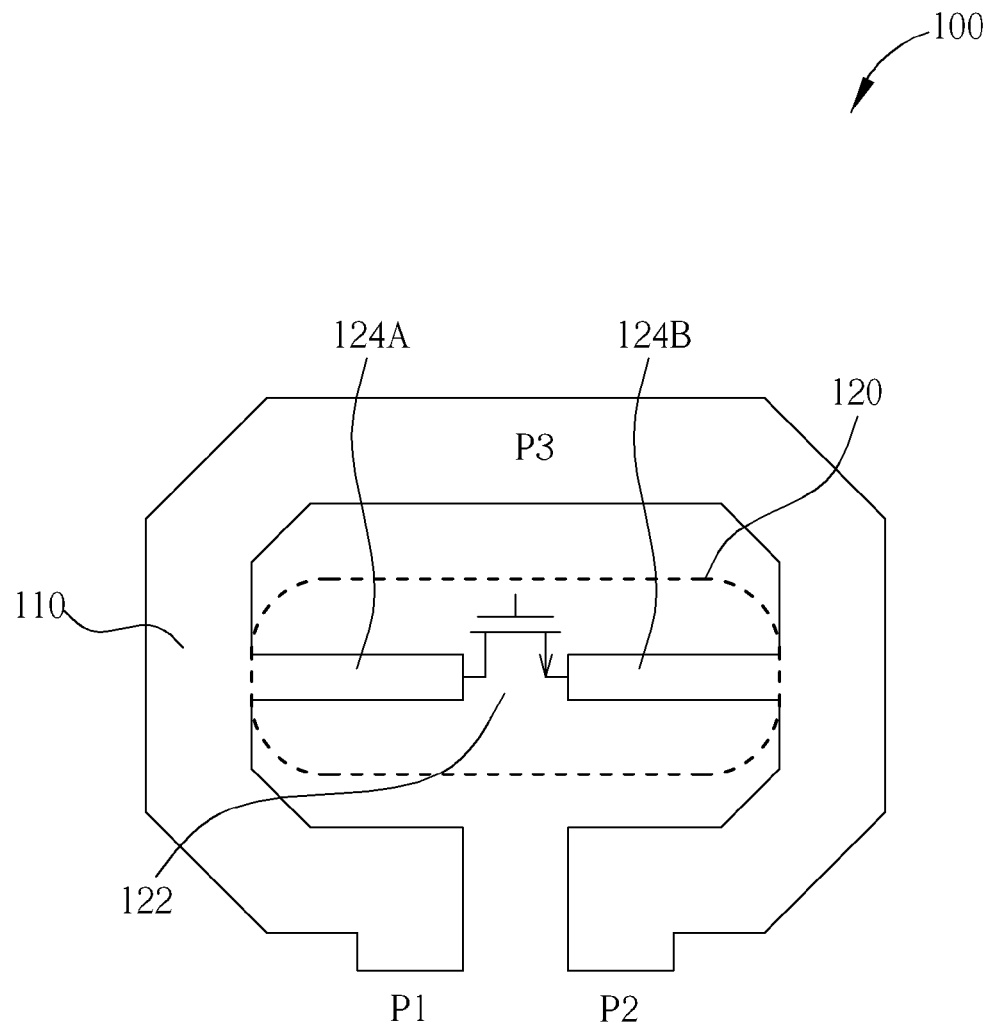
FIG. 1A illustrates a tunable inductor according to a first embodiment of the present invention.

Please refer to FIG. 1A, which illustrates a tunable inductor 100 according to a first embodiment of the present invention, where the tunable inductor 100 can be utilized for implementing a single digitally controlled oscillator (DCO) with multiple mode frequency coverage. The tunable inductor 100 comprises a main wiring 110 and at least one tuning module such as the tuning module 120, where the main wiring 110 is arranged to define (more particularly, encircle) an inductor area of the tunable inductor 100, i.e. the area inside the main wiring 110 with the aforementioned at least one tuning module being temporarily ignored. Please note that, in this embodiment and variations thereof, no matter whether the main wiring 110 is closed or spiral, and no matter whether the number of turns of the main wiring 110 is greater than one, the main wiring 110 can be regarded as a wiring that encircles the inductor area of the tunable inductor 100. According to this embodiment, each tuning module of the aforementioned at least one tuning module, such as the tuning module 120 shown in FIG. 1A, comprises a first switch 122 positioned within the inductor area, and further comprises at least one auxiliary wiring such as the auxiliary wirings 124A and 124B. In practice, the aforementioned at least one auxiliary wiring is positioned within the inductor area and is coupled between two nodes of the main wiring 110, and the first switch 122 is disposed on the aforementioned at least one auxiliary wiring and is arranged to selectively couple the two nodes of the main wiring 110 with each other.

As shown in FIG. 1A, the first switch 122 and the aforementioned at least one auxiliary wiring such as the auxiliary wirings 124A and 124B divide at least one portion (e.g. a portion or all) of the inductor area mentioned above into two partial areas, where the aforementioned at least one portion of the inductor area in this embodiment comprises all of the inductor area. With the aforementioned at least one tuning module (e.g. tuning module 120) being temporarily ignored, the main wiring 110 forms a current path to be utilized in some situations. As a result of implementing the tuning module 120, a new current path passing through the first switch 122, the aforementioned at least one auxiliary wiring such as the auxiliary wirings 124A and 124B, and a portion of the main wiring 110 (more particularly, the current path that starts from the port P1, passes through the tuning module 120, and ends at the port P2) encircles one of the two partial areas.

The aforementioned at least one tuning module (e.g. the tuning module 120) is arranged to selectively couple (more particularly, electrically connect) associated nodes of the main wiring 110. According to this embodiment, when the first switch 122 is turned on, the tuning module 120 couples (more particularly, electrically connects) two nodes of the main wiring 110, such as a first node at the center of the junction between the auxiliary wiring 124A and the main wiring 110 and a second node at the center of the junction between the auxiliary wiring 124B and the main wiring 110 in order to change (more particularly, decrease) the effective diameter of the tunable inductor 100, whereby the effective inductance of the tunable inductor 100 is changed (more particularly, decreased). More specifically, the auxiliary wirings 124A and 124B are arranged to couple the two nodes (e.g. the first node and the second node) when the first switch 122 is turned on.

For example, in a situation where the first switch 122 is turned on, a majority of current on the main wiring 110 flows through the port P1, the auxiliary wiring 124A, the first switch 122, the auxiliary wiring 124B, and the port P2, rather than flowing through any intermediate node of the main wiring 110, where the intermediate node is between the two nodes mentioned above. Please note that the intermediate node of this embodiment can be located at the center along the main wiring 110, such as a central node where the port P3 is positioned. On the contrary, in a situation where the first switch 122 is turned off, a majority of current on the main wiring 110 flows through the port P1, the port P3, and the port P2, rather than flowing through the auxiliary wiring 124A, the first switch 122, the auxiliary wiring 124B.

Figure 1B:
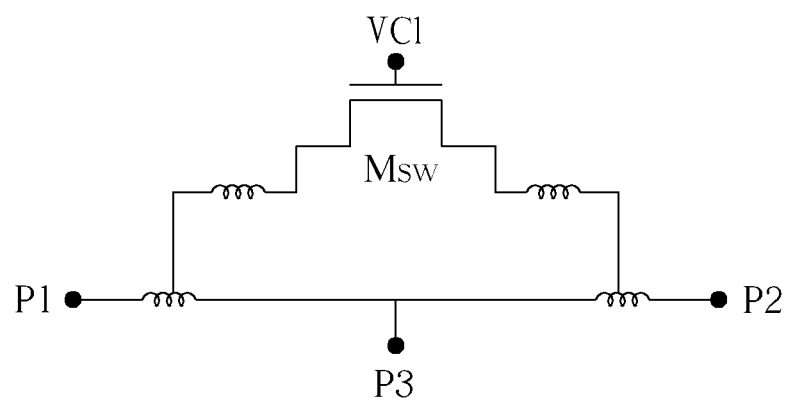
FIG. 1B illustrates an equivalent circuit of the tunable inductor shown in FIG. 1A according to an embodiment of the present invention.

FIG. 1B illustrates an equivalent circuit of the tunable inductor 100 shown in FIG. 1A according to an embodiment of the present invention. For example, the first switch 122 can be implemented with a Metal Oxide Semiconductor Field Effect Transistor (MOSFET), and can be referred to as a MOSFET switch Msw, where a control signal VC1 is utilized for turning on or turning off the MOSFET switch Msw. For better comprehension, the main wiring 110 is expressed as a first partial inductor between the ports P1 and P3 and a second partial inductor between the ports P3 and P2. Based upon the architecture shown in FIG. 1A, the first partial inductor and the second partial inductor mentioned above can be illustrated as the same inductor symbol whose spring-like patterns start from the port P1 through to the port P2. In addition, the auxiliary wiring 124A is expressed as a third partial inductor between the first partial inductor (i.e. the one having an end being the port P1) and the MOSFET switch Msw, and the auxiliary wiring 124B is expressed as a fourth partial inductor between the MOSFET switch Msw and the second partial inductor (i.e. the one having an end being the port P2). Based upon the architecture shown in FIG. 1A, each of the third partial inductor and the fourth partial inductor can be illustrated as an inductor symbol whose spring-like patterns start from one end through to the other end.

Please note that the number of turns of the main wiring 110 is equal to one in the first embodiment. This is for illustrative purposes only, and is not meant to be a limitation of the present invention. According to some variations of the first embodiment, the number of turns of the main wiring 110 can be greater than one. For example, the main wiring 110 may be arranged to be a spiral path on the same plane. In another example, the main wiring 110 may be arranged to be a spring-like path ranging from one plane to another plane, rather than a spiral path on the same plane.

In addition, according to the embodiment shown in FIG. 1A, the number of tuning modules within the tunable inductor 100 is equal to one. This is for illustrative purposes only, and is not meant to be a limitation of the present invention. According to some variations of the embodiment shown in FIG. 1A, the number of tuning modules within the tunable inductor 100 can be greater than one. For example, in these variations, the tunable inductor 100 may comprise a plurality of tuning modules 120-1, 120-2, . . . , and 120-M arranged within the inductor area, where each tuning module of the tuning modules 120-1, 120-2, . . . , and 120-M can be a copy of the tuning module 120 shown in FIG. 1A.

Figure 2:
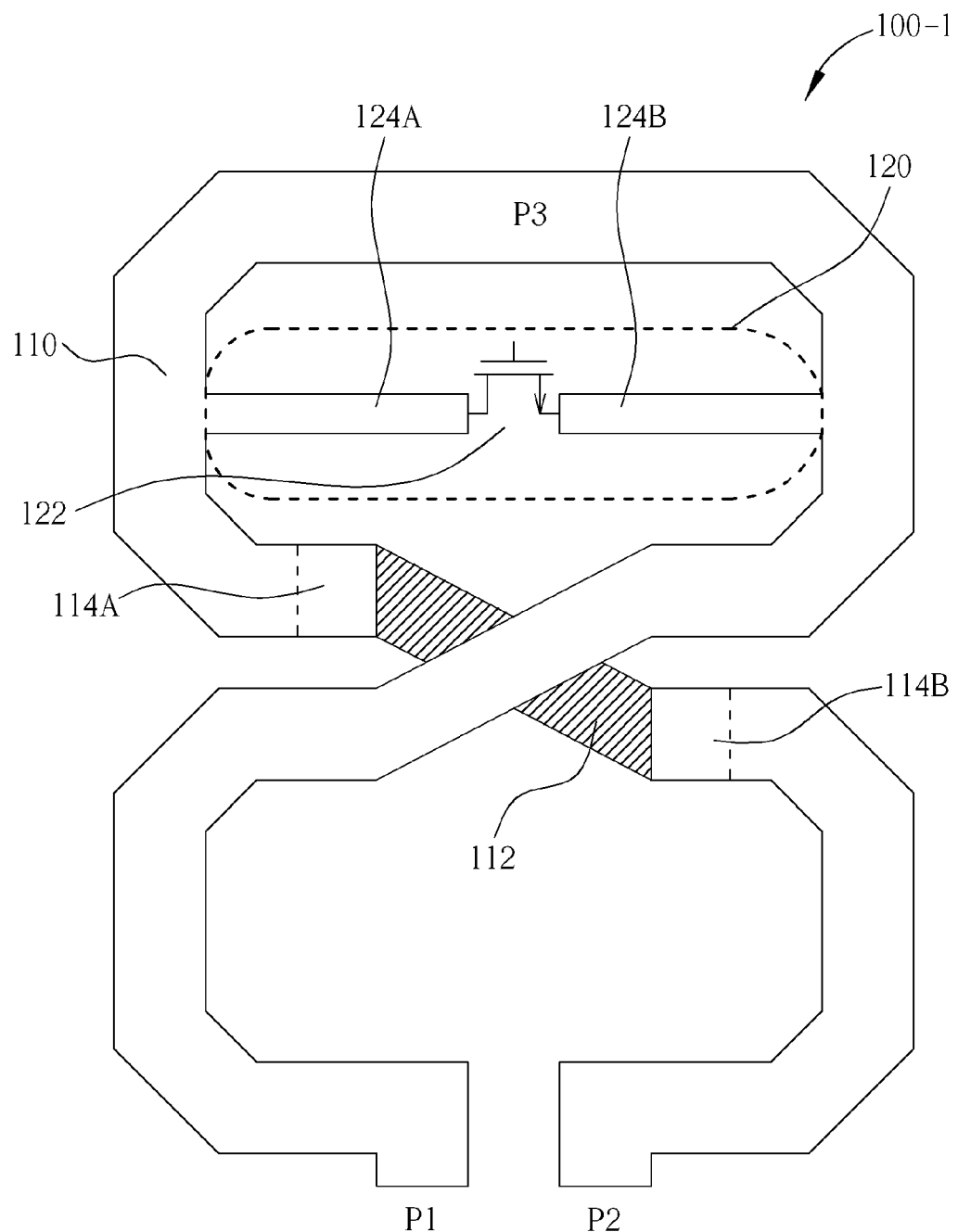
FIG. 2 illustrates a tunable inductor according to a second embodiment of the present invention.

FIG. 2 illustrates a tunable inductor 100-1 according to a second embodiment of the present invention. In this embodiment, the shape of the main wiring 110 mentioned above may vary. For example, the main wiring 110 may form an 8 shape such as that shown in FIG. 2, and therefore, the inductor area mentioned above may extend and comprise an upper portion corresponding to the upper half of the 8 shape and a lower portion corresponding to the lower half of the 8 shape. Thus, the first switch 122 and the aforementioned at least one auxiliary wiring such as the auxiliary wirings 124A and 124B divide the upper portion of the inductor area of this embodiment into two partial areas. As shown in FIG. 2, the main wiring 110 ranges within multiple planes by utilizing some metal connections 114A and 114B (which can be referred to as vias in some situations, for simplicity). In addition, the non-shaded portions of the main wiring 110 and the auxiliary wirings 124A and 124B are arranged in the same plane, and the shaded portions of the main wiring 110 are arranged in another plane, where the shaded portions of the main wiring 110 represent the same auxiliary wiring 112 between the metal connections 114A and 114B. For brevity, similar descriptions are not repeated.

Figure 3A:
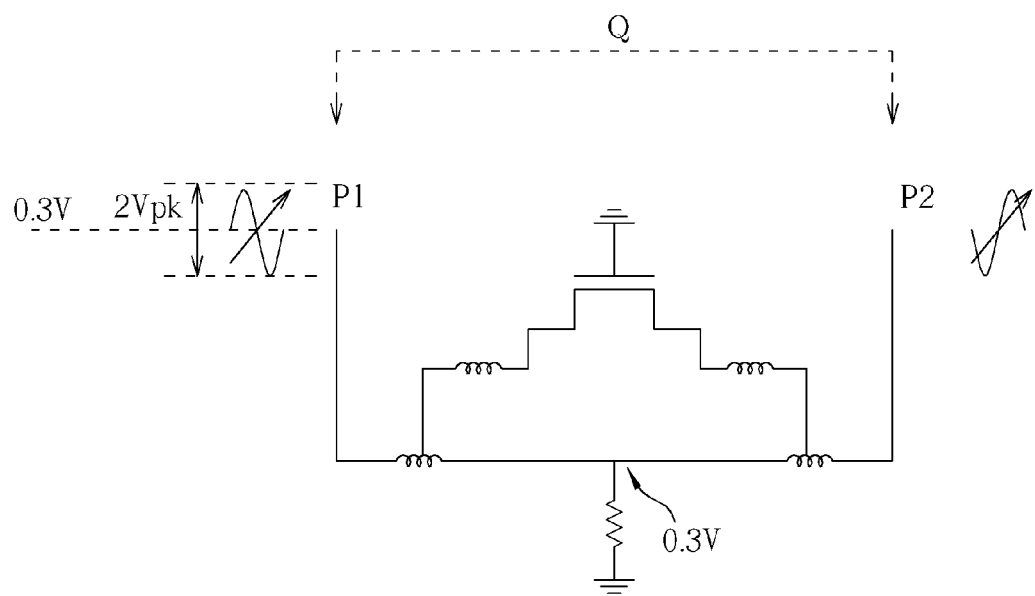
FIG. 3A illustrates a tunable inductor according to a third embodiment of the present invention.

FIG. 3A illustrates a tunable inductor according to a third embodiment of the present invention. For better comprehension, some numerals of the embodiment shown in FIG. 1A can be utilized for describing the tunable inductor of this embodiment. According to this embodiment, the tunable inductor 100 further comprises a resistor electrically connected to the aforementioned intermediate node of the main wiring 110, and more particularly, the central node where the port P3 shown in FIG. 1A (or FIG. 1B) is positioned. This resistor is arranged to elevate the direct current (DC) level at the intermediate node, and therefore, to elevate the DC level at any of the two ends of the main wiring 110. For example, installing the resistor shown in FIG. 3A elevates the DC level at the intermediate node to a voltage level of 0.3V, allowing the voltage swing applied to the tunable inductor 100 to range from −Vpk to Vpk without significantly reducing the Q value of the tunable inductor 100, where the range of voltage swing is labeled "2Vpk" in FIG. 3A.

Figure 3B:
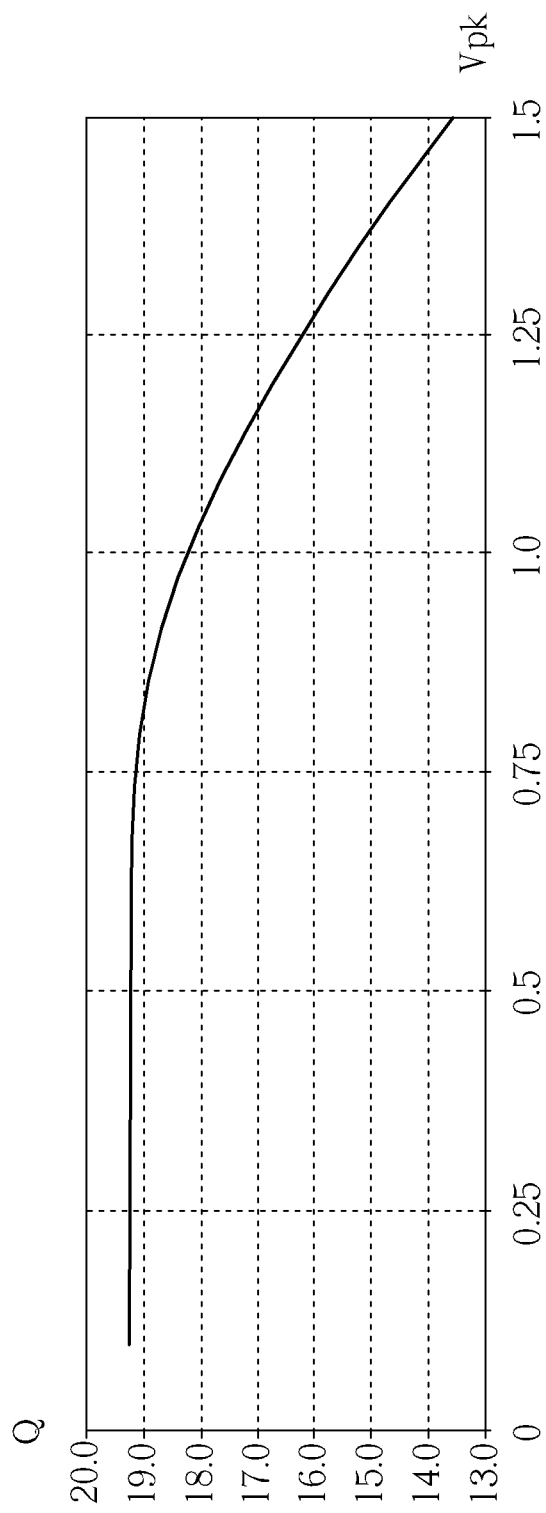
FIG. 3B illustrates the Q curve of the tunable inductor shown in FIG. 3A in a situation where the resistance of the resistor shown in FIG. 3A approaches/reaches zero according to an embodiment of the present invention.

FIG. 3B illustrates the Q curve of the tunable inductor shown in FIG. 3A in a situation where the resistance of the resistor shown in FIG. 3A approaches/reaches zero according to an embodiment of the present invention, where horizontal axis represents the peak voltage Vpk, and the vertical axis represents the Q value. As shown in FIG. 3B, the Q value degrades significantly as the peak voltage Vpk increases due to the fact the MOSFET switch Msw is partially turned ON when the voltage swing applied to the tunable inductor 100 is low enough.

Figure 3C:
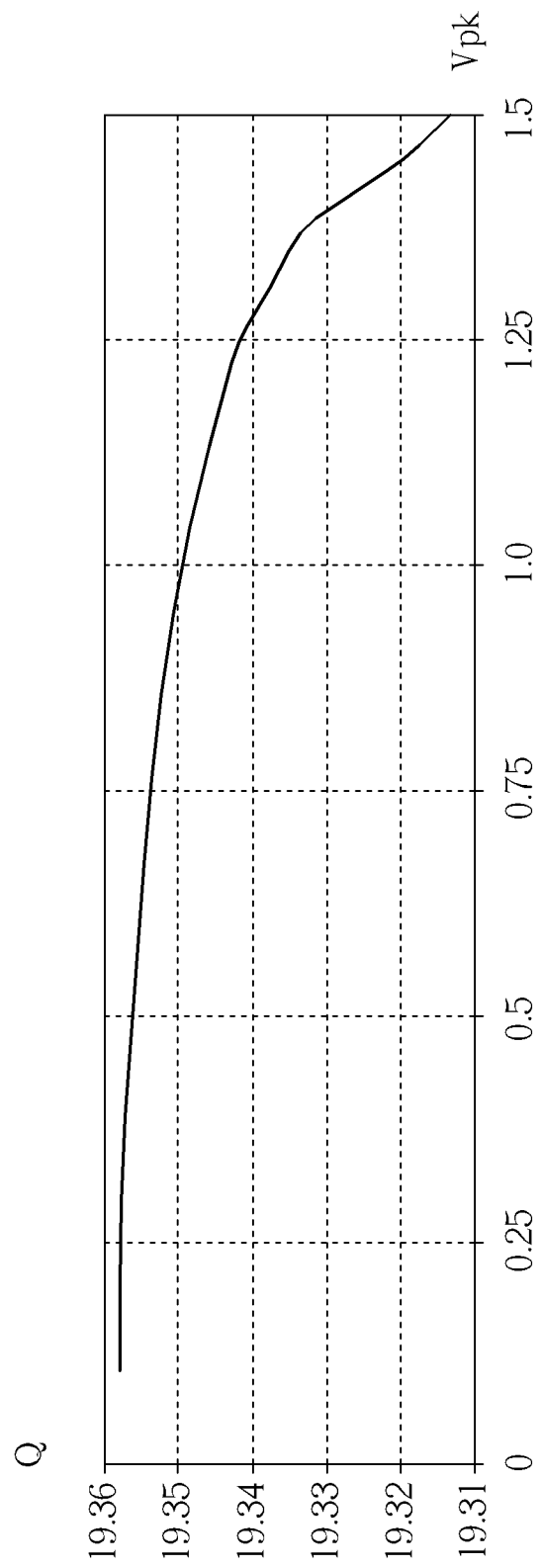
FIG. 3C illustrates the Q curve of the tunable inductor shown in FIG. 3A according to another embodiment of the present invention.

FIG. 3C illustrates the Q curve of the tunable inductor shown in FIG. 3A according to another embodiment of the present invention, where horizontal axis represents the peak voltage Vpk, and the vertical axis represents the Q value. In comparison with the embodiment shown in FIG. 3B, the Q value of the embodiment shown in FIG. 3C can be kept high as the peak voltage Vpk increases.

Figure 4A:
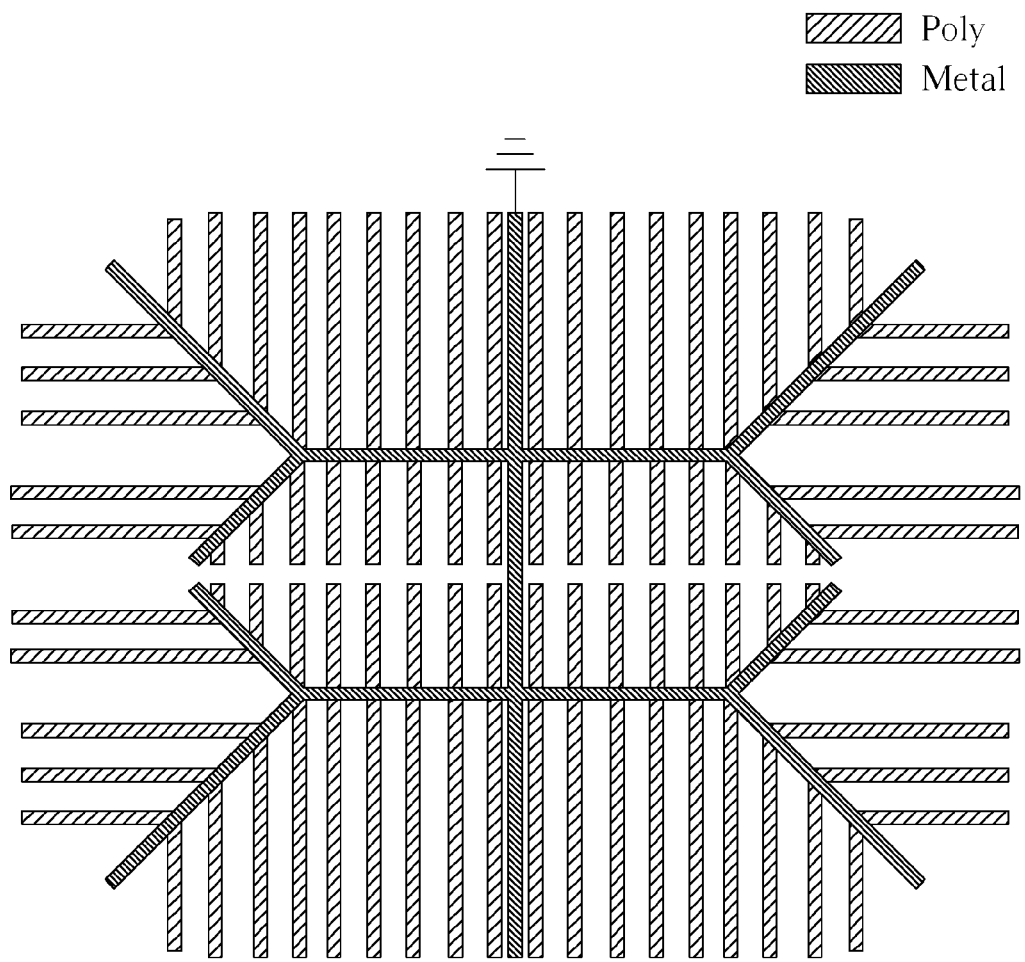
FIG. 4A illustrates a patterned ground plane of the tunable inductor shown in FIG. 1A according to a fourth embodiment of the present invention.

FIG. 4A illustrates a patterned ground plane (or patterned ground shield (PGS)) of the tunable inductor 100 shown in FIG. 1A according to a fourth embodiment of the present invention. The patterned ground plane is arranged to decrease the energy loss of the tunable inductor 100, and more particularly, to prevent the tunable inductor 100 from suffering energy loss in the substrate. According to this embodiment, the patterned ground plane comprises a plurality of first conductive sections such as metal lines, and further comprises a plurality of second conductive sections such as polycrystalline silicon (or polysilicon, poly-Si, or simply "poly") lines, where the conductivity of the second conductive sections is less than the conductivity of the first conductive sections. This is for illustrative purposes only, and is not meant to be a limitation of the present invention. According to some variations of this embodiment, both the first conductive sections and the second conductive sections can be metal lines, which means they have the same conductivity. Please note that, in the embodiment shown in FIG. 4A, the first conductive sections are physically connected to all of the second conductive sections. More specifically, the first conductive sections provide the second conductive sections with alternating current (AC) ground paths, where the first conductive sections are electrically connected to a ground reference (or AC ground), which can be any static voltage level.

As shown in FIG. 4A, there is no closed loop in the patterned ground plane, whereby the so-called Eddy current loss can be prevented. More particularly, there is no closed loop formed along the physical connection of the first conductive sections and the second conductive sections in the patterned ground plane. In practice, a portion of the first conductive sections (e.g. the four metal lines positioned around the leftmost portion) is arranged to form a W-like shape comprising two V shapes, while another portion of the first conductive sections (e.g. the four metal lines positioned around the rightmost portion) is arranged to form another W-like shape comprising two V shapes. In one example, the two V shapes of any of the W-like shapes disclosed above are disconnected (i.e. there is a gap in between these two V shapes). Thus, according to the embodiment, each of the W-like shapes mentioned above is formed with two separate V shapes. In addition, the orientation of some second conductive sections is perpendicular to that of the associated trace formed with at least one portion of the aforementioned at least one tuning module, and more particularly, the tuning module 120. Additionally, the vertical part of the first conductive sections serves as an inter-connection, while the arrangement shown in FIG. 4A prevents forming closed loop.

Please note that the W-like shapes disclosed above may vary in different embodiments, such as variations of this embodiment. For example, the positions and/or orientation of the first conductive sections respectively forming the four strokes of a W-like shape may be varied in response to the change in architecture of the main wiring 110 and/or the auxiliary wiring(s) of tuning module 120. In another example, the first conductive sections respectively forming the four strokes of a W-like shape may have the same length. In another example, the length of at least one of the first conductive sections respectively forming the first and the last strokes of a W-like shape may be less than the length of at least one of the first conductive sections respectively forming the second and the third strokes of the same W-like shape.

Figure 4B:
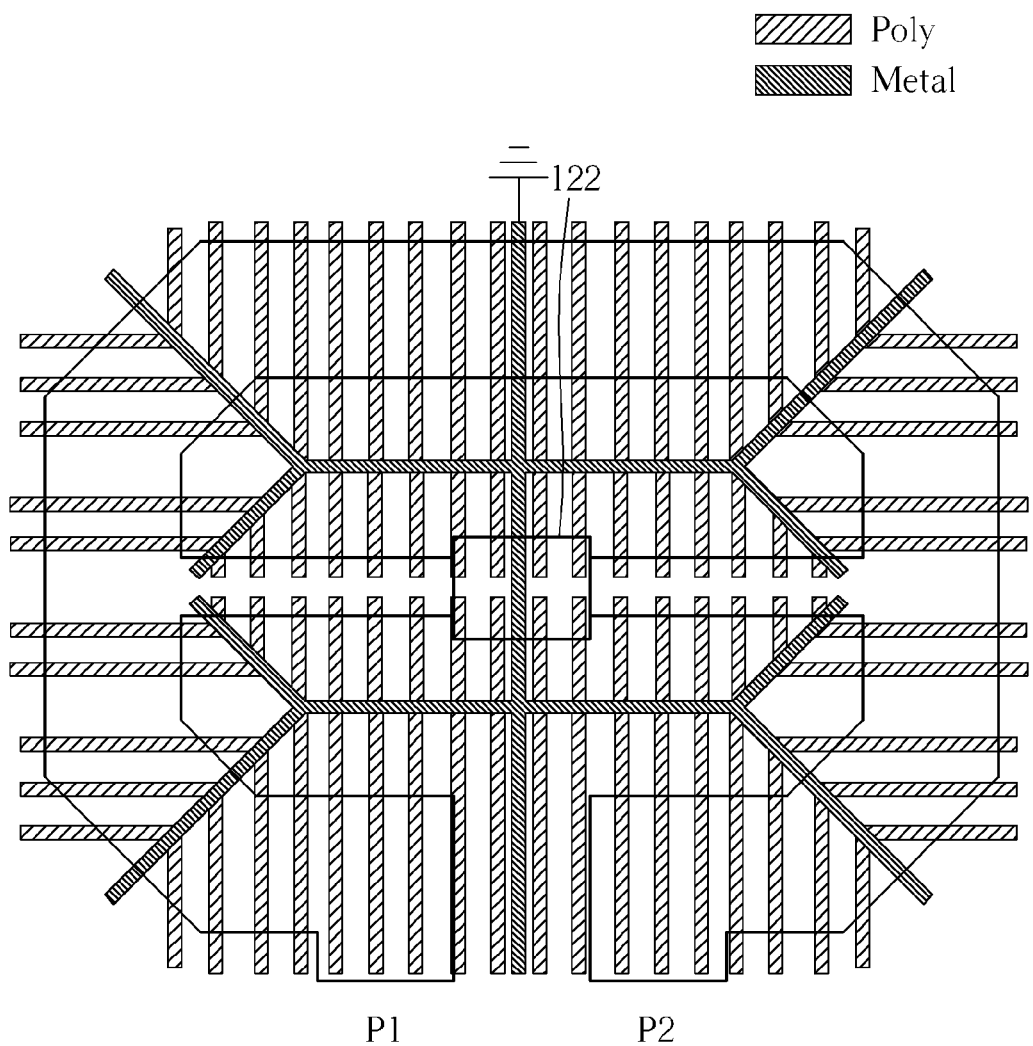
FIG. 4B illustrates the relative location of the patterned ground plane shown in FIG. 4A with respect to the tunable inductor shown in FIG. 1A according to an embodiment of the present invention.

FIG. 4B illustrates the relative location of the patterned ground plane shown in FIG. 4A with respect to the tunable inductor 100 shown in FIG. 1A according to an embodiment of the present invention. With regard to each portion of the first conductive sections forming a W-like shape (e.g. the four metal lines positioned around the leftmost portion, or the four metal lines positioned around the rightmost portion), the orientation of the portion of the first conductive sections corresponds to the associated traces formed with the main wiring 110 and the aforementioned at least one tuning module such as the tuning module 120. For example, the orientation of a first conductive section within the portion of the first conductive sections, such as a metal line corresponding to any of the first stoke and the last stroke of the W-like shape, is perpendicular to that of the associated trace formed with a portion of the main wiring 110, and more particularly, the partial wiring of the associated corner (e.g. the upper left corner, the upper right corner, the lower left corner, or the lower right corner) within the main wiring 110.

As shown in FIG. 4B, the orientation of at least one portion of the second conductive sections is perpendicular to that of the associated traces formed with the main wiring 110 and the aforementioned at least one tuning module such as the tuning module 120, respectively. For example, the orientation of most horizontal second conductive sections in any of the leftmost region and the rightmost region shown in FIG. 4B is perpendicular to that of the associated trace formed with the vertical partial wiring of the associated side (e.g. the left side or the right side) within the main wiring 110. In another example, the orientation of most vertical second conductive sections in any of the topmost region and the bottommost region shown in FIG. 4B is perpendicular to that of the associated trace formed with the horizontal partial wiring of the associated side (e.g. the top side or the bottom side) within the main wiring 110. In another example, the orientation of most vertical second conductive sections in the central region is perpendicular to that of the associated trace formed with the auxiliary wirings 124A and 124B.

Figure 5A:
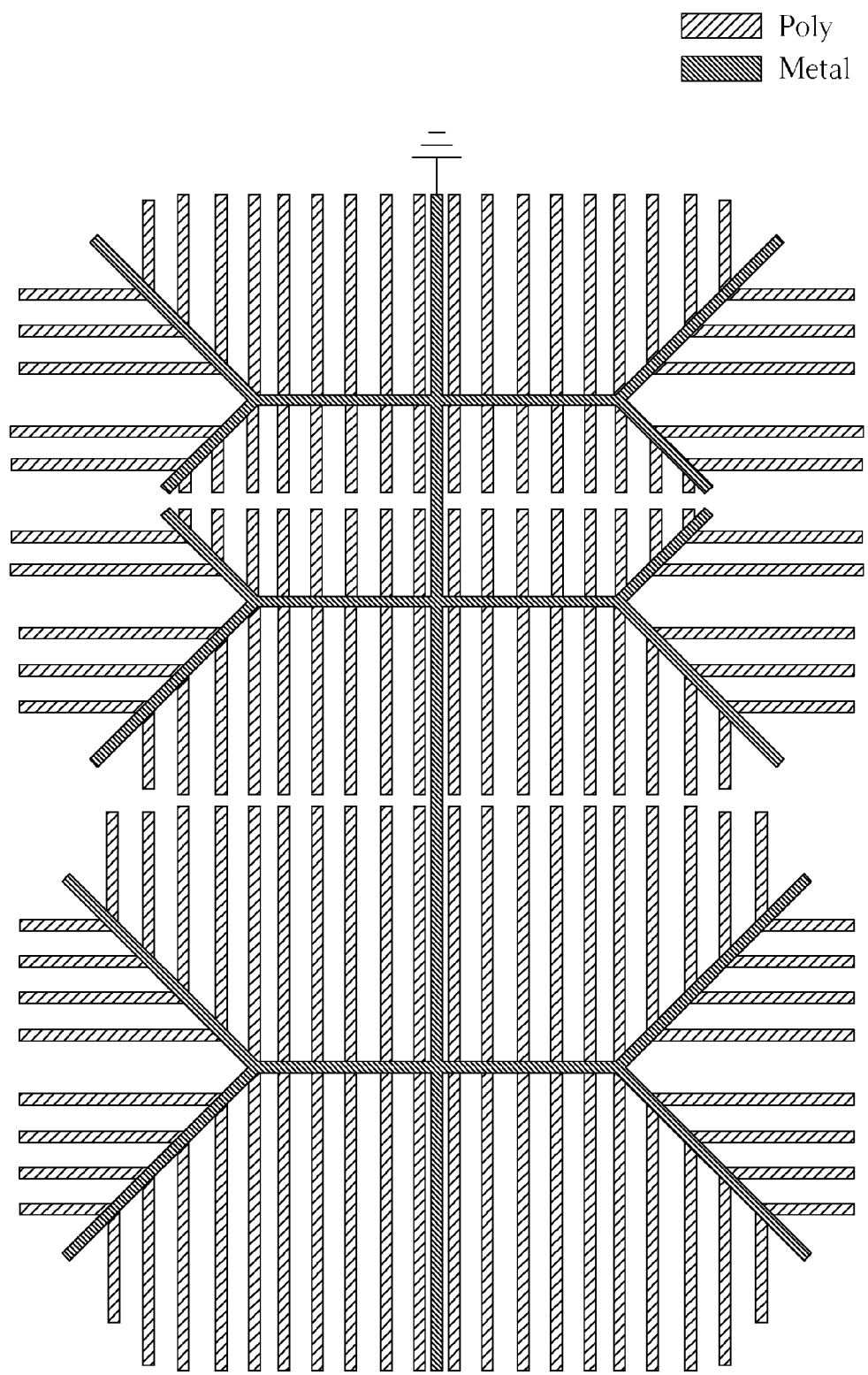
FIG. 5A illustrates a patterned ground plane of the tunable inductor shown in FIG. 2 according to a fifth embodiment of the present invention.

FIG. 5A illustrates a patterned ground plane (or PGS) of the tunable inductor 100-1 shown in FIG. 2 according to a fifth embodiment of the present invention. As disclosed in the second embodiment, the main wiring 110 may form the 8 shape, and the inductor area mentioned above may extend and comprise the upper portion corresponding to the upper half of the 8 shape and the lower portion corresponding to the lower half of the 8 shape. Thus, referring to FIG. 5A, the patterned ground plane mentioned above may vary in response to the extension of the inductor area. For brevity, similar descriptions are not repeated.

Figure 5B:
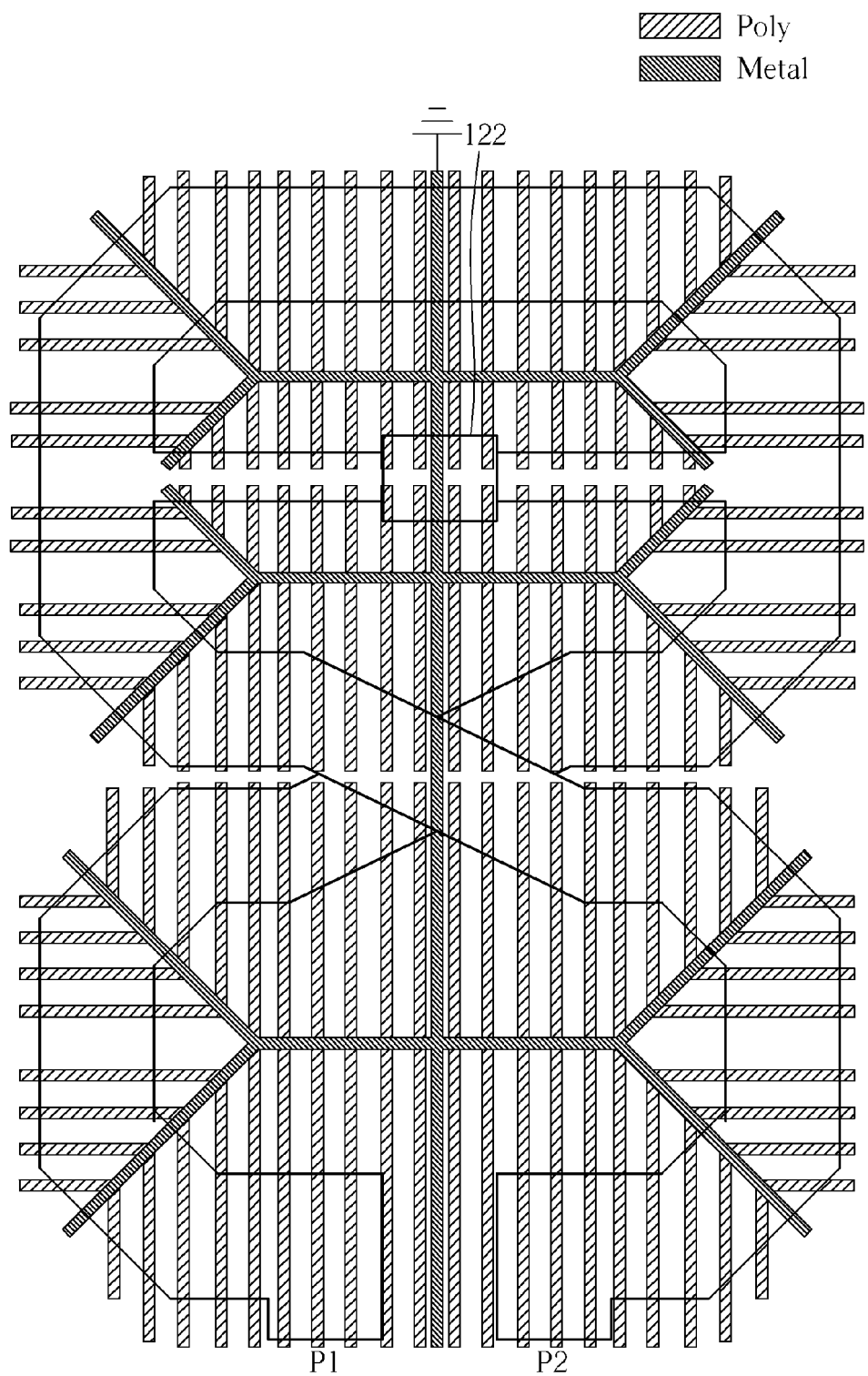
FIG. 5B illustrates the relative location of the patterned ground plane shown in FIG. 5A with respect to the tunable inductor shown in FIG. 2 according to an embodiment of the present invention.

FIG. 5B illustrates the relative location of the patterned ground plane shown in FIG. 5A with respect to the tunable inductor 100-1 shown in FIG. 2 according to an embodiment of the present invention. For brevity, similar descriptions are not repeated.

Figure 6:
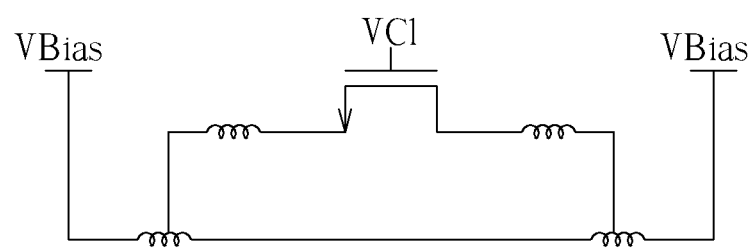
FIG. 6 illustrates a tunable inductor with the two ends of the main wiring thereof being electrically connected to two voltage sources, respectively, according to a sixth embodiment of the present invention.

FIG. 6 illustrates a tunable inductor with the two ends of the main wiring thereof being electrically connected to two voltage sources (labeled "VBias"), respectively, according to a sixth embodiment of the present invention. For better comprehension, some numerals of the embodiment shown in FIG. 1A can be utilized for describing the tunable inductor of this embodiment. According to this embodiment, the voltage elevation of the central node mentioned above can be carried out by utilizing at least one voltage bias. More particularly, the tunable inductor 100 is a voltage biased inductor arranged to operate with at least one voltage source being applied to at least one end of the main wiring 110. For example, the two voltage sources (labeled "VBias") are applied to the ports P1 and P2, respectively. For brevity, similar descriptions are not repeated.

Figure 7:
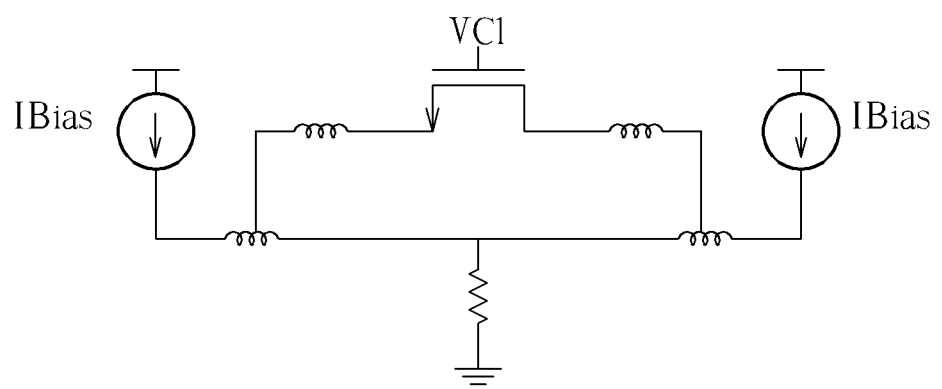
FIG. 7 illustrates a tunable inductor with the two ends of the main wiring thereof being electrically connected to two current sources, respectively, according to a seventh embodiment of the present invention.

FIG. 7 illustrates a tunable inductor with the two ends of the main wiring thereof being electrically connected to two current sources (labeled "IBias"), respectively, according to a seventh embodiment of the present invention. For better comprehension, some numerals of the embodiment shown in FIG. 1A can be utilized for describing the tunable inductor of this embodiment. According to this embodiment, the voltage elevation of the central node mentioned above can be carried out by utilizing at least one current bias, with a resistor such as that shown in FIG. 3A being utilized. More particularly, the tunable inductor 100 is a current biased inductor arranged to operate with at least one current source being applied to at least one end of the main wiring 110. For example, the two current sources (labeled "IBias") are applied to the ports P1 and P2, respectively. For brevity, similar descriptions are not repeated.

Figure 8A:
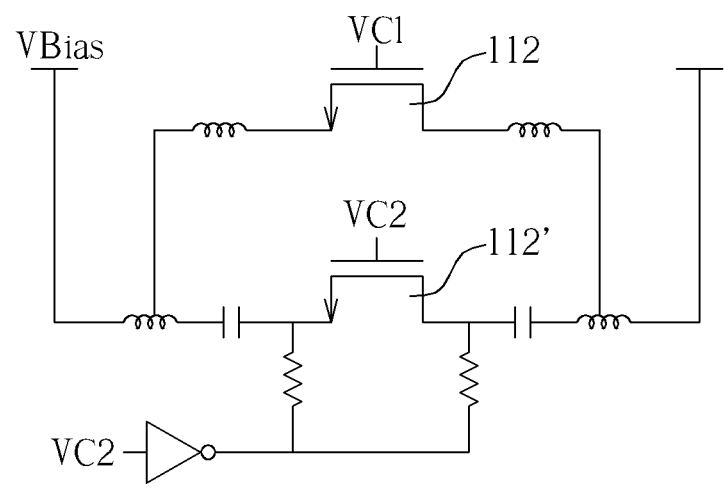
FIG. 8A illustrates a tunable inductor with one of the two ends of the main wiring thereof being electrically connected to a voltage source according to an eighth embodiment of the present invention, where the tunable inductor comprises multiple switches.

FIG. 8A illustrates a tunable inductor with one of the two ends of the main wiring thereof being electrically connected to a voltage source (labeled "VBias") according to an eighth embodiment of the present invention, where the tunable inductor comprises multiple switches. For better comprehension, some numerals of the embodiment shown in FIG. 1A can be utilized for describing the tunable inductor of this embodiment. According to this embodiment, the voltage elevation of the central node mentioned above can be carried out by utilizing at least one voltage bias. More particularly, the tunable inductor 100 is a voltage biased inductor arranged to operate with at least one voltage source being applied to at least one end of the main wiring 110. For example, the voltage source (labeled "VBias") is applied to one of the ports P1 and P2.

As shown in FIG. 8A, the tunable inductor 100 further comprises a second switch 122' (more particularly, the switch controlled by the control signal VC2 in this embodiment) disposed at the intermediate node of the main wiring 110, and more particularly, the central node mentioned above. The second switch 122' is arranged to electrically block the main wiring 110 when the second switch 122' is turned off. As a result of installing the second switch 122', in a situation where the first switch 122 is turned on and the second switch 122' is turned off, the associated Eddy current can be blocked and the Q value can be increased. In practice, the second switch 122' can also be a MOSFET switch.

According to this embodiment, the tunable inductor 100 further comprises a switching enhancement module arranged to enhance the switching characteristics of the second switch 122'. As a result of installing the switching enhancement module, the source voltage and the drain voltage of the second switch 122' can be independent of the voltage source (labeled "VBias"). For example, the switching enhancement module of this embodiment may comprise an inverter, two capacitors, and two resistors. Thus, when the control signal VC2 turns off the second switch 122', the source voltage and the drain voltage of the second switch 122' are pull to high level(s), therefore preventing Q degradation. On the contrary, when the control signal VC2 turns on the second switch 122', the source voltage and the drain voltage of the second switch 122' are pull to the ground level. For brevity, similar descriptions are not repeated.

Please note that the switching enhancement module shown in FIG. 8A comprises the inverter, the two capacitors, and the two resistors. This is for illustrative purposes only, and is not meant to be a limitation of the present invention. According to some variations of this embodiment, the switching enhancement module may comprise at least one inverter, multiple capacitors, and/or multiple resistors. For example, the switching enhancement module of another of these variations comprises the two capacitors and the two resistors, without utilizing the inverter, where the node between the two resistors (i.e. the same node that is originally utilized for receiving the output of the inverter) is now arranged to receive the control signal VC1 in this variation.

Figure 8B:
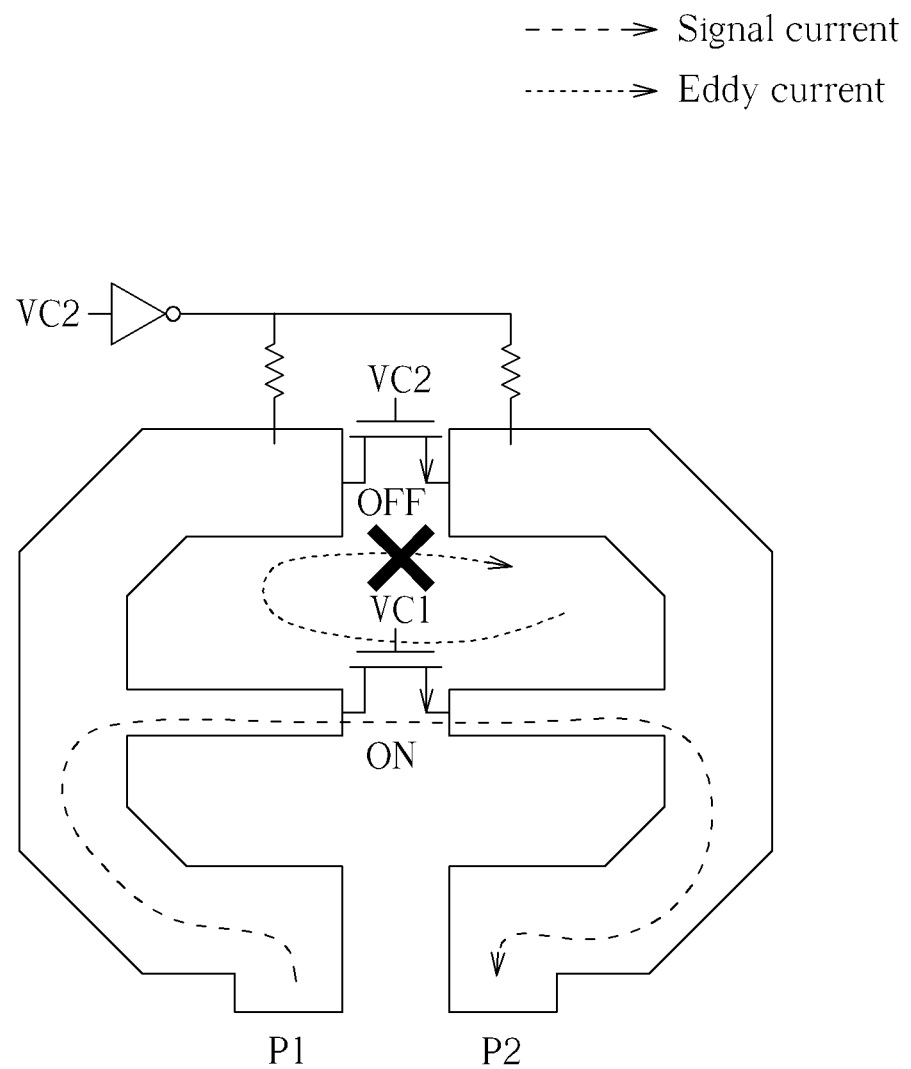
FIG. 8B illustrates the signal current of the tunable inductor shown in FIG. 8A according to an embodiment of the present invention, where the associated Eddy current is blocked.

FIG. 8B illustrates the signal current of the tunable inductor shown in FIG. 8A according to an embodiment of the present invention. For better comprehension, some numerals of the embodiment shown in FIG. 1A can be utilized for describing the tunable inductor of this embodiment. According to this embodiment, the two capacitors mentioned above are omitted.

For example, in a situation where the control signal VC1 is at a high level and the control signal VC2 is at a low level, the first switch 122 controlled by the control signal VC1 is turned on (labeled "ON") and the second switch 122' controlled by the control signal VC2 is turned off (labeled "OFF"). As a result, the signal current of the tunable inductor flows through the port P1, the auxiliary wiring 124A, the first switch 122, the auxiliary wiring 124B, and the port P2, rather than flowing through the second switch 122' on the main wiring 110. As a result of turning off the second switch 122', the associated Eddy current is blocked. According to this embodiment, the DC level is equivalent to the output voltage level of the voltage source (labeled "VBias" in FIG. 8A).

Figure 8C:
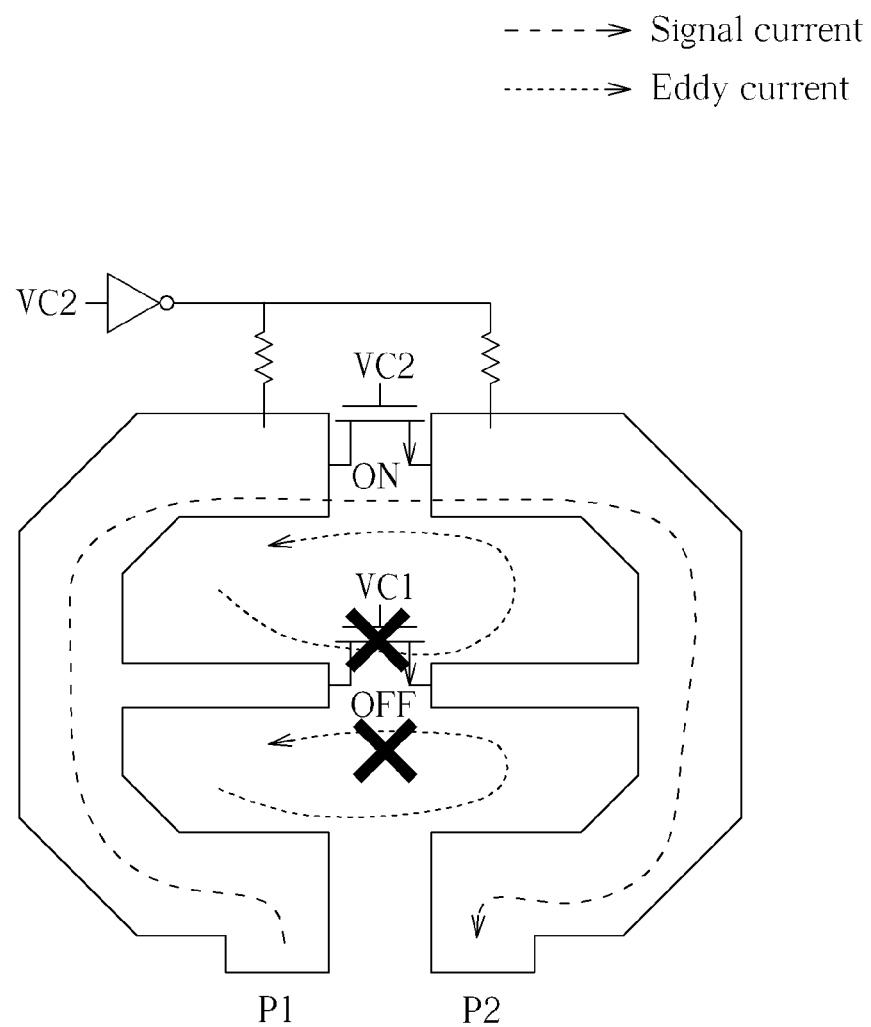
FIG. 8C illustrates the signal current of the tunable inductor shown in FIG. 8A according to another embodiment of the present invention, where the associated Eddy currents are blocked.

FIG. 8C illustrates the signal current of the tunable inductor shown in FIG. 8A according to another embodiment of the present invention. For better comprehension, some numerals of the embodiment shown in FIG. 1A can be utilized for describing the tunable inductor of this embodiment. Similarly, the two capacitors mentioned above are omitted in this embodiment.

For example, in a situation where the control signal VC1 is at a low level and the control signal VC2 is at a high level, the first switch 122 controlled by the control signal VC1 is turned off (labeled "OFF") and the second switch 122' controlled by the control signal VC2 is turned on (labeled "ON"). As a result, the signal current of the tunable inductor flows through the port P1, the second switch 122' on the main wiring 110, and the port P2, rather than flowing through the auxiliary wiring 124A, the first switch 122, and the auxiliary wiring 124B. As a result of turning off the first switch 122, the associated Eddy currents are blocked. According to this embodiment, the DC level is equivalent to the output voltage level of the voltage source (labeled "VBias" in FIG. 8A).

It is an advantage of the present invention that the tunable inductor in any of the embodiments/variations disclosed above can enhance the area efficiency. In addition, by utilizing the tunable inductor in any of the embodiments/variations disclosed above, a goal of implementing a single DCO with multiple mode frequency coverage can be achieved. As a result, the related art problems (e.g. reliability limitation of the conventional DCO, and compromised performance of the conventional DCO) will no longer be an issue.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A tunable inductor, comprising:
a main wiring arranged to define an inductor area of the tunable inductor, wherein the main wiring comprises multiple ends; and
at least one tuning module comprising:
at least one auxiliary wiring, positioned within the inductor area, coupled between two nodes of the main wiring, wherein at least one node of the two nodes is not positioned at any end of the multiple ends of the main wiring; and
a first switch, disposed on the at least one auxiliary wiring, arranged to selectively couple the two nodes of the main wiring with each other.

2. The tunable inductor of claim 1, wherein when the first switch is turned on, the at least one tuning module couples the two nodes of the main wiring in order to change an effective diameter of the tunable inductor, whereby an effective inductance of the tunable inductor is changed.

3. The tunable inductor of claim 1, wherein the first switch and the at least one auxiliary wiring divide at least one portion of the inductor area into two partial areas.

4. The tunable inductor of claim 3, wherein a current path passing through the first switch, the at least one auxiliary wiring, and a portion of the main wiring encircles one of the two partial areas.

5. The tunable inductor of claim 1, wherein the tunable inductor is a current biased inductor arranged to operate with at least one current source being applied to at least one end of the main wiring.

6. The tunable inductor of claim 1, wherein the tunable inductor is a voltage biased inductor arranged to operate with at least one voltage source being applied to at least one end of the main wiring.

7. A tunable inductor, comprising:
a main wiring arranged to define an inductor area of the tunable inductor;
at least one tuning module comprising:
at least one auxiliary wiring, positioned within the inductor area, coupled between two nodes of the main wiring; and
a first switch, disposed on the at least one auxiliary wiring, arranged to selectively couple the two nodes of the main wiring with each other; and
a resistor electrically connected to an intermediate node of the main wiring, wherein the intermediate node is between the two nodes, and the resistor is arranged to elevate a direct current (DC) level at the intermediate node.

8. A tunable inductor, comprising:
a main wiring arranged to define an inductor area of the tunable inductor;
at least one tuning module comprising:
at least one auxiliary wiring, positioned within the inductor area, coupled between two nodes of the main wiring; and
a first switch, disposed on the at least one auxiliary wiring, arranged to selectively couple the two nodes of the main wiring with each other; and
a second switch disposed at an intermediate node of the main wiring, wherein the intermediate node is between the two nodes, and the second switch is arranged to electrically block the main wiring when the second switch is turned off.

9. The tunable inductor of claim 8, further comprising:
a switching enhancement module arranged to enhance switching characteristics of the second switch.

10. A tunable inductor, comprising:
a main wiring arranged to define an inductor area of the tunable inductor;
at least one tuning module arranged to selectively couple associated nodes of the main wiring; and
a patterned ground plane arranged to decrease energy loss of the tunable inductor, wherein the patterned ground plane comprises a plurality of first conductive sections, and a portion of the plurality of first conductive sections is arranged to form a W-like shape.

11. The tunable inductor of claim 10, wherein the patterned ground plane further comprises a plurality of second conductive sections; and conductivity of the plurality of second conductive sections is less than conductivity of the plurality of first conductive sections.

12. The tunable inductor of claim 11, wherein an orientation of at least one portion of the plurality of second conductive sections is perpendicular to that of associated traces formed with the main wiring and the at least one tuning module, respectively.

13. The tunable inductor of claim 10, wherein an orientation of one or more first conductive sections in the portion of the plurality of first conductive sections is perpendicular to that of associated traces formed with associated partial wirings of the main wiring.

14. The tunable inductor of claim 10, wherein another portion of the plurality of first conductive sections is arranged to form another W-like shape.

15. The tunable inductor of claim 10, wherein the patterned ground plane further comprises a plurality of second conductive sections; and there is no closed loop formed by physical connection of the plurality of first conductive sections and the plurality of second conductive sections in the patterned ground plane.

16. The tunable inductor of claim 10, wherein the patterned ground plane further comprises a plurality of second conductive sections; and all conductive sections of the plurality of first conductive sections are made of metal lines, and all conductive sections of the plurality of second conductive sections are made of polysilicon or metal lines.

17. The tunable inductor of claim 10, wherein all conductive sections of the plurality of first conductive sections are electrically connected to a ground reference.

18. The tunable inductor of claim 10, wherein the at least one tuning module comprises:
   at least one auxiliary wiring, positioned within the inductor area, coupled between two nodes of the main wiring; and
   a first switch, disposed on the at least one auxiliary wiring, arranged to selectively couple the two nodes of the main wiring with each other.

* * * * *